(12) United States Patent
Kang et al.

(10) Patent No.: US 10,651,261 B2
(45) Date of Patent: May 12, 2020

(54) DISPLAY DEVICE

(71) Applicant: LG DISPLAY CO., LTD., Seoul (KR)

(72) Inventors: Gyutae Kang, Goyang-si (KR); NamKil Park, Paju-si (KR); Mardin Kwon, Seoul (KR); Seongwoong Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 5 days.

(21) Appl. No.: 15/998,520

(22) Filed: Aug. 16, 2018

(65) Prior Publication Data
US 2019/0103453 A1    Apr. 4, 2019

(30) Foreign Application Priority Data

Aug. 16, 2017    (KR) .......................... 10-2017-0103740

(51) Int. Cl.
| | | |
|---|---|---|
| *H01L 27/32* | (2006.01) | |
| *H01L 51/52* | (2006.01) | |
| *G09G 3/3225* | (2016.01) | |
| *G09G 3/3208* | (2016.01) | |
| *H01L 51/00* | (2006.01) | |

(52) U.S. Cl.
CPC ....... *H01L 27/3276* (2013.01); *G09G 3/3208* (2013.01); *G09G 3/3225* (2013.01); *H01L 27/3279* (2013.01); *H01L 51/5237* (2013.01); *G09G 2300/0426* (2013.01); *G09G 2320/0223* (2013.01); *G09G 2320/0233* (2013.01); *H01L 51/0097* (2013.01)

(58) Field of Classification Search
CPC ............... G09G 3/3216; G09G 3/3233; G09G 2320/0233; G09G 3/3208; G09G 3/3225; G09G 2300/0426; G09G 2320/0223; H01L 27/3276; H01L 27/3279; H01L 51/5237; H01L 51/0097; G02F 1/13452
See application file for complete search history.

(56) References Cited

U.S. PATENT DOCUMENTS

2011/0102402 A1 *  5/2011  Han .................... H01L 27/3279
                                                              345/211
2014/0146253 A1 *  5/2014  Lee ................... G02F 1/136286
                                                              349/33

FOREIGN PATENT DOCUMENTS

KR    10-2016-0050149 A    5/2016

* cited by examiner

*Primary Examiner* — Nelson M Rosario
(74) *Attorney, Agent, or Firm* — Birch, Stewart, Kolasch & Birch, LLP

(57) ABSTRACT

A display device can include a substrate including an active area having a plurality of pixels and a non-active area adjacent to the active area; a plurality of power lines in the active area, configured to transmit a power voltage to the plurality of pixels, and including a plurality of first power lines and a plurality of second power lines; and a power link line disposed in the non-active area and including a lower power link line connected to the plurality of power lines, a first lower connecting line extending from the lower power link line, and a second lower connecting line extending from the lower power link line, in which the first and second lower connecting lines extend in a different direction than the lower power link line, the plurality of first power lines includes at least two sets of first power lines spaced apart from each other, and the plurality of second power lines includes at least two sets of second power lines spaced apart from each other.

17 Claims, 9 Drawing Sheets

DISPLAY DEVICE

CROSS-REFERENCE TO RELATED APPLICATIONS

This application claims the priority of Korean Patent Application No. 10-2017-0103740 filed in the Republic of Korea on Aug. 16, 2017, the entirety of which is incorporated herein by reference.

BACKGROUND

Technical Field

The present disclosure relates to a display device, and more particularly, to a display device that reduces a power voltage drop and improves brightness uniformity.

Description of the Related Art

Panel display devices such as a liquid crystal display device, an organic light emitting diode display device, a quantum dot display device, have been attracting a lot of attention as next-generation display devices due to their small thickness and low power consumption.

A display device includes a driver integrated circuit (IC) configured to transmit power voltage for driving a plurality of pixels. The driver IC transmits power voltage to each of the pixels through power lines disposed in the display device.

However, the power voltage transmitted by the driver IC may undergo a voltage drop while passing through the power lines. Thus, the power voltage supplied to each pixel may not be uniform, which may cause a decrease in the brightness uniformity of the display device. Accordingly, there is demand for supplying uniform power voltage to a plurality of pixels in a display device.

SUMMARY

The inventors of the present disclosure recognized that there is an increasing demand for reducing the size of non-active areas in display devices by bending the non-active areas in flexible display devices. Then, the inventors of the present disclosure reduced the size of the non-active area by removing some portions from the non-active area. However, the inventors of the present disclosure also recognized that it is necessary to realign various lines and components disposed in the non-active area in order to maximize the removable portion therein. The inventors of the present disclosure also recognized that a design to reduce the space occupied by power lines in the non-active area would be needed to further reduce the size of the non-active area. Further, the inventors realized that when power voltage is supplied to a plurality of pixels from a driver IC, power voltage drop may occur due to resistance in the power lines, causing non-uniformity in brightness among the plurality of pixels. To compensate for the power voltage drop, a higher voltage was typically supplied.

Accordingly, the inventors of the present disclosure invented a display device that reduces the size of the non-active area and reduces power voltage drop to supply uniform power voltage.

An object to be achieved by the present disclosure is a reduction in power voltage drop by adding points from which power voltage can be supplied, in order to improve brightness uniformity in a display device.

Another object to be achieved by the present disclosure is improvement in data voltage delay deviation caused by a parasitic capacitance, by aligning the power lines used to transmit power voltage, such that they overlap the data lines used to transmit data voltage, in order to improve brightness uniformity.

Objects of the present disclosure are not limited to those mentioned above, and other objects not mentioned above can be clearly understood by those skilled in the art from the following descriptions.

According to an aspect of the present disclosure, a display device is provided. The display device includes a substrate including an active area with a plurality of pixels and a non-active area adjacent to the active area. The display device further includes a plurality of power lines disposed in the active area and configured to transmit power voltage to the plurality of pixels. The plurality of power lines includes a plurality of first power lines and a plurality of second power lines. The display device further includes a power link line disposed in the non-active area. The power link line includes a lower power link line connected to the plurality of power lines, a first lower connecting line, and a second lower connecting line. The first lower connecting line and the second lower connecting line extend from the lower power link line. The plurality of first power lines includes at least two sets of first power lines that are equidistant from the first lower connecting line. Similarly, the plurality of second power lines includes at least two sets of second power lines that are equidistant from the second lower connecting line. Therefore, power voltage drop can be reduced by repositioning the points at which power voltage is transmitted, and, thus, brightness uniformity can be improved.

According to another aspect of the present disclosure, a display device is provided. The display device includes a substrate including an active area with a plurality of pixels and a non-active area adjacent to the active area. The display device further includes a plurality of power lines disposed in the active area, configured to transmit power voltage to a plurality of pixels. The plurality of power lines includes a plurality of first power lines and a plurality of second power lines. The display device further includes a plurality of power link lines disposed in the non-active area. The plurality of power link lines includes a first lower power link line connected to a plurality of first power lines and a second lower power link line connected to a plurality of second power lines. Further, the first lower power link line and the second lower power link line are disposed in a left area and a right area, respectively, of the substrate to minimize the amount of power voltage drop in the plurality of power lines and power link lines.

Additional details regarding the embodiments are included in the detailed description and drawings below.

According to the present disclosure, it is possible to reduce power voltage drop by repositioning the points at which power voltage is transmitted and reducing the length of the power voltage lines and, as a result, the resistance thereof.

Further, according to the present disclosure, it is possible to improve signal delay deviation caused by parasitic capacitance and line resistance by aligning power lines used to transmit power voltage such that they overlap with data lines used to transmit data voltage.

The advantages of the present disclosure are not limited to the contents exemplified above, and additional advantages are disclosed in the present specification.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION OF THE DISCLOSURE

Figure 1:
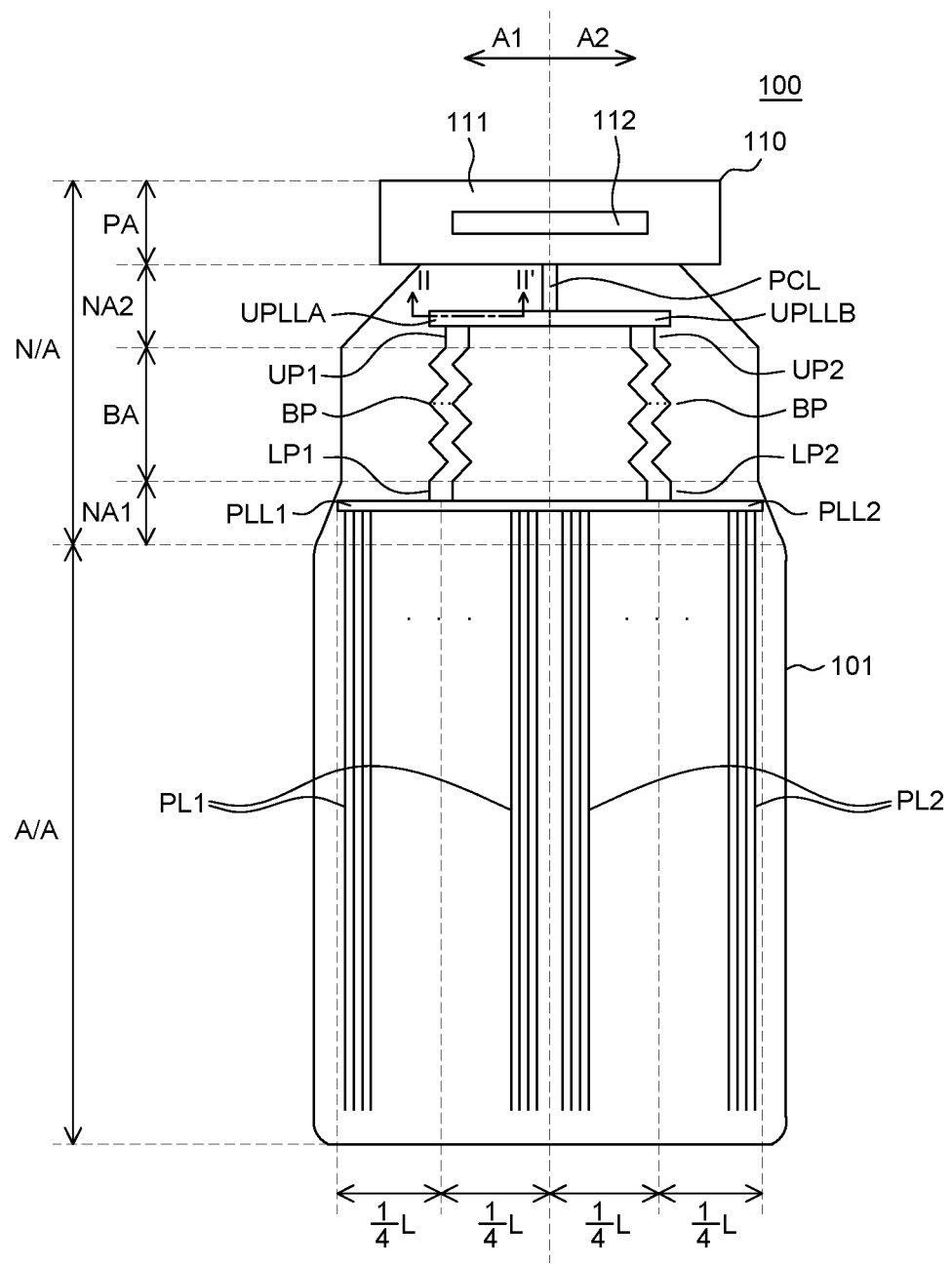
FIG. 1 is a plan view of a display device according to an embodiment of the present disclosure.

The advantages and features of the present disclosure, as well as the means by which these advantages and features are realized will be clear by referring to the embodiments described below in more detail, together with the accompanying drawings. However, the present disclosure is not limited to the embodiments disclosed herein, but may be implemented in various forms. The embodiments are provided by way of example only, so that those skilled in the art can fully understand the present disclosure. The scope of the present disclosure will be defined only by the scope of the appended claims.

The shapes, sizes, ratios, angles, numbers, and the like illustrated in the accompanying drawings to show the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. Terms such as "including," "having," and "comprising" as used herein are generally intended to allow other components to be added unless the terms are used with the term "only." Any singular references may also be applied in the plural sense, unless expressly stated otherwise.

Descriptions and measurements of components should be interpreted to include an ordinary error range, even if not expressly stated.

When terms such as "on," "above," "below," or "next" are used to describe the position or relation between components, one or more other components may be positioned between said components, unless the terms are used with the term "immediately" or "directly."

For example, when an element or layer is disposed "on" another element or layer, another layer or another element may be interposed directly on the other element or therebetween.

Although the terms "first," "second," and the like are used to describe various components, the positioning or order of these components are not confined by these terms. These terms are merely used for distinguishing one component from the other components. Therefore, the first component to be mentioned below may be referred to as a second component in a technical concept of the present disclosure.

The size and thickness of each component illustrated in the drawings are illustrated for convenience of description, and the present disclosure is not limited to the relative size and thickness of the components as illustrated.

The features of the various embodiments of the present disclosure can be either partially or entirely adhered to or combined with each other and can be assembled and operated in technically various ways, and the embodiments can be implemented independent of or in association with each other.

Hereinafter, a display device according to the embodiments of the present disclosure will be described in detail with reference to the accompanying drawings.

FIG. 1 is a plan view of a display device according to an embodiment of the present disclosure. FIG. 1 illustrates a substrate 101, power link lines, power lines, and a driver IC 112 among various components of a display device 100 for convenience of explanation.

The substrate 101 is a base member configured to support various components of the display device 100 and may be formed of an insulating material. For example, the substrate 101 may be formed of glass or a plastic material such as polyimide.

Referring to FIG. 1, the substrate 101 may include an active area A/A and a non-active area N/A.

The active area A/A refers to an area where a plurality of pixels is disposed to display an image. In the active area A/A, a display unit configured to display an image and a circuit unit configured to drive the display unit may be disposed. For example, if the display device 100 is an organic light emitting diode display device, the display unit may include an organic light emitting diode. That is, the display unit may include an anode, an organic layer on the anode, and a cathode on the organic layer. The organic layer may be composed of, for example, a hole transport layer, a hole injection layer, an organic emission layer, an electron injection layer, and an electron transport layer. Further, the circuit unit may be composed of various components such as power lines, thin film transistors, storage capacitors, gate lines, and data lines, but may not be limited thereto. Hereinafter, the display device 100 will be assumed to be an organic light emitting diode display device for convenience of explanation, but may not be limited to organic light emitting diode display devices.

Referring to FIG. 1, the active area A/A may have an edge-rounded shape or a corner-rounded shape. As design has recently become more of a point of emphasis, there has been demand for active areas A/A in other shapes, rather than just the rectangular shape. Accordingly, the substrate 101 of the display device 100, according to an embodiment of the present disclosure has an edge-rounded shape, but is not limited thereto. In some embodiments, the edges may be angled or the corners may be angled.

The non-active area N/A refers to an area where an image is not displayed and where various lines and circuits for driving the active area A/A of the display unit are disposed. As such, a driver IC 112 configured to transmit signals for driving the display unit, power link lines, data link lines, and the like may be disposed in the non-active area N/A.

The non-active area N/A may be defined as an area extended from the active area A/A as illustrated in FIG. 1. However, the non-active area N/A may not be limited thereto and may be defined as an area surrounding the active area A/A.

Referring to FIG. 1, the non-active area N/A includes a first non-active area NA1, bending area BA, second non-active area NA2, and pad area PA. The first non-active area NA1 refers to an area extended from the active area A/A, and the bending area BA refers to an area extended from the first non-active area NA1, and is bendable. The second non-active area NA2 refers to an area extended from the bending area BA. The pad area PA refers to an area extended from the second non-active area NA2 in which a pad is disposed.

In addition, the substrate 101 is defined by the active area A/A and non-active area N/A, and may also be viewed as comprising a first area A1 and a second area A2. The active area A/A and the non-active area N/A are defined by dividing the substrate 101 in a transverse direction, and the first area A1 and the second area A2 may be defined by dividing the substrate 101 in a longitudinal direction. The first area A1 refers to the left area of the substrate 101 and may be defined to include parts of the active area A/A, first non-active area NA1, bending area BA, second non-active area NA2, and pad area PA, respectively. The second area A2 refers to the right area of the substrate 101 and may include other parts of the active area A/A, first non-active area NA1, bending area BA, second non-active area NA2, and pad area PA, respectively. In this instance, the first area A1 and the second area A2 may be bilaterally symmetrical.

A flexible film 110 refers to a film formed by placing various components on a base film 111 having flexibility, and functions to transmit a signal to the pixels of the active area A/A. The flexible film 110 is disposed in the pad area PA of the non-active area N/A and transmits power voltage and data voltage to the pixels of the active area A/A through the pad disposed in the pad area PA. The flexible film 110 includes the base film 111 and the driver IC 112, and may further include other various components. A printed circuit board can be connected to the flexible film 110 of FIG. 1.

The base film 111 is configured to support the flexible film 110. The base film 111 may be formed of an insulating material. For example, the base film 111 may be formed of an insulating material having flexibility.

The driver IC 112 is configured to process data for displaying an image and a driving signal for processing data. The driver IC 112 may be mounted on the substrate 101 or base film 111 of the display device 100 through a chip on glass (COG), chip on film (COF), or tape carrier package (TCP) method. FIG. 1 illustrates the driver IC 112 as mounted on the flexible film 110 through the COF method for convenience of explanation, but may not be limited thereto.

A plurality of power lines is disposed in the active area A/A, and power link lines are disposed in the non-active area N/A. The plurality of power lines is configured to transmit power voltage to the plurality of pixels disposed in the active area A/A. The plurality of power lines receives power voltage from the power link lines and then transmits the power voltage to the plurality of pixels.

The power link lines are disposed in the non-active area N/A and configured to transmit power voltage from the driver IC 112 to the power lines. In more detail, the power link lines are disposed in the first non-active area NA1, the bending area BA, and the second non-active area NA2, and connect the driver IC 112 with each of the plurality of power lines. Thus, the power link lines can transmit power voltage to the plurality of power lines.

The plurality of power lines and power link lines may be formed of a conductive material. For example, the plurality of power lines and power link lines may be formed of one of a variety of materials used in manufacturing an organic light emitting diode, gate electrode, source electrode, or drain electrode of a thin film transistor in the active area A/A. Further, the plurality of power lines and power link lines may be formed as a single layer or a multi-layer. In more detail, the plurality of power lines and power link lines may be formed of molybdenum (Mo), chromium (Cr), titanium (Ti), nickel (Ni), neodymium (Nd), copper (Cu), and an alloy of silver (Ag) and magnesium (Mg).

FIG. 1 illustrates the plurality of power lines and power link lines as being disposed on the substrate 101. However, other various lines, such as gate lines, as well as data lines and data link lines configured to transmit data voltage to the plurality of pixels of the active area A/A, may be further disposed on the substrate 101. The data lines and data link lines will be discussed in greater detail in reference to FIG. 2.

The power link line includes a lower power link line disposed in the first non-active area NA1, a plurality of bending patterns BP disposed in the bending area BA, an upper power link line disposed in the second non-active area NA2 and a pad connecting line PCL (e.g., the lower power link line is closer to the A/A than the upper power link line). The power link line may further include a lower connecting line, respectively a first lower connecting line LP1 in the first area A1 and a second lower connecting line LP2 in the second area A2, disposed in the first non-active area NA1 connecting each lower power link line to a bending pattern BP. The power link line may further include a first upper connecting line UP1 in the first area A1 and a second upper connecting line UP2 in the second area A2, disposed in the second non-active area NA2 connecting the upper power link line with a bending pattern BP.

The pad connecting line PCL is connected to the pad disposed in the pad area PA and transmits power voltage to the upper power link line disposed in the second non-active area NA2.

The upper power link line is disposed on the central portion of the second non-active area NA2, and includes a first portion UPLLA extending to the first area A1 and a second portion UPLLB extending to the second area A2. The upper power link line is connected to the pad connecting line PCL on a central portion of the substrate 101. The first portion UPLLA and second portion UPLLB of the upper power link line extend to the central portions of the first area A1 and second area A2, respectively, in the second non-active area NA2.

The upper power link line is connected to the plurality of bending patterns BP. In more detail, the first portion UPLLA of the upper power link line is connected to the bending pattern BP through the first upper connecting line UP1. The second portion UPLLB is connected to another bending pattern BP through the second upper connecting line UP2. In this instance, some of the plurality of bending patterns BP are connected to the first portion UPLLA of the upper power link line through the first upper connecting line UP1. The other bending patterns among the plurality of bending patterns BP are connected to the second portion UPLLB of the upper power link line through the second upper connecting line UP2.

The first upper connecting line UP1 and the second upper connecting line UP2 are extended from the plurality of bending patterns BP toward the second non-active area NA2 and are disposed in the second non-active area NA2. The first upper connecting line UP1 is connected to a bending pattern BP and the first portion UPLLA of the upper power link line. The second upper connecting line UP2 is connected to a bending pattern BP and the second portion UPLLB of the upper power link line. In more detail, the first upper connecting line UP1 is connected to an end of the first portion UPLLA of the upper power link line and the second upper connecting line UP2 is connected to an end of the second portion UPLLB of the upper power link line. However, the first upper connecting line UP1 and the second upper connecting line UP2 may be connected to other portions of the upper power link line depending on the design, and are therefore not limited thereto.

The plurality of bending patterns BP of the power link line is disposed in the bending area BA. The bending area BA refers to the area extending from the first non-active area NA1 to the second non-active area NA2 as described above. Ultimately, however, the bending area BA is bent in a bending direction in the final product (e.g., to allow circuitry to be placed behind and overlapping with the display panel). Therefore, the bending patterns BP of the power link line may be formed into a pattern of a specific shape to minimize stress and cracks on the plurality of link lines in the bending area BA. For example, the bending patterns BP may employ repeated patterns having at least one of a diamond, rhombic, zigzag, or circular shape, but is not limited thereto. The bending patterns BP may employ a variety of shapes to reduce stress and cracks on the bending patterns BP.

The lower power link line transmits power voltage received through the upper power link line and the plurality of bending patterns BP to each of the first power lines PL1 and second power lines PL2 in the active area A/A.

The lower power link line is disposed in the first non-active area NA1 and includes a first lower power link line PLL1 and a second lower power link line PLL2. The first lower power link line PLL1 is disposed in the first non-active area NA1 and extends to both ends (e.g., opposite sides) of the first area A1. The second lower power link line PLL2 is also disposed in the first non-active area NA1 and extends to both ends (e.g., opposite sides) of the second area A2. Further, the first lower power link line PLL1 and the second lower power link line PLL2 are connected at the boundary between the first area A1 and the second area A2. For example, the first lower power link line PLL1 and the second lower power link line PLL2 may be a single line.

In addition, the lower power link line (e.g., PLL1 and PLL2) is connected to the plurality of bending patterns BP. In more detail, the first lower power link line PLL1 and the second lower power link line PLL2 of the lower power link line are connected to the plurality of bending patterns BP. For example, the first lower power link line PLL1 may be connected to the bending patterns BP through the first lower connecting line LP1. And, the second lower power link line PLL2 may be connected to the bending patterns BP through the second lower connecting line LP2. In this instance, one bending pattern BP is connected to the first lower power link line PLL1 through the first lower connecting line LP1, and another bending pattern BP is connected to the second lower power link line PLL2 through the second lower connecting line LP2.

The first lower connecting line LP1 and the second lower connecting line LP2 are extended from each of the bending patterns BP toward the first non-active area NA1, where they are disposed. The first lower connecting line LP1 is connected to a bending pattern BP and the first lower power link line PLL1. The second lower connecting line LP2 is connected to a bending pattern BP and the second lower power link line PLL2.

The plurality of first power lines PL1 is disposed in the first area A1 of the active area A/A, and the plurality of second power lines PL2 is disposed in the second area A2 of the active area A/A. Also, an end of each of the plurality of first power lines PL1 and plurality of second power lines PL2 extend into the first non-active area NA1 and connect to the first lower power link line PLL1 and the second lower power link line PLL2, respectively. Therefore, the plurality of first power lines PL1 are connected to the single first lower power link line PLL1 and the plurality of second power lines PL2 are connected to the single second lower power link line PLL2.

In the above-described configuration of the power link line, power voltage from the driver IC 112 may be sequentially transmitted to the pad connecting line PCL, the first portion UPLLA of the upper power link line, the first upper connecting line UP1, a bending pattern BP, the first lower connecting line LP1, the first lower power link line PLL1, and the first plurality of power lines PL1, transmitting power voltage to pixels disposed in the first area A1. Further, the power voltage from the driver IC 112 may be sequentially transmitted to the pad connecting line PCL, the second portion UPLLB of the upper power link line, the second upper connecting line UP2, a bending pattern BP, the second lower connecting line LP2, the second lower power link line PLL2, and the second plurality of power lines PL2, transmitting power voltage to pixels disposed in the second area A2.

The first lower connecting line LP1 may be connected to a central portion of the first lower power link line PLL1, and the second lower connecting line LP2 may be connected to a central portion of the second lower power link line PLL2, as depicted in FIG. 1. That is, the first lower connecting line LP1 and the second lower connecting line LP2 may be connected, not to the ends, but to the central portions of the first lower power link line PLL1 and the second lower power link line PLL2, respectively.

As described above, the first lower power link line PLL1 may extend to both ends (e.g., opposite sides) of the first area A1, and the first portion UPLLA of the upper power link line may only extend to the central portion of the first area A1. Further, a bending pattern BP may be connected to an end of the first portion UPLLA of the upper power link line in the central portion of the first area A1 through the first upper connecting line UP1. Likewise, the second lower power link line PLL2 may extend to both ends of the second area A2, and the second portion UPLLB of the upper power link line may only extend to the central portion of the second area A2. Further, a bending pattern BP may be connected to an end of the second portion UPLLB of the upper power link line in the central portion of the second area A2 through the second upper connecting line UP2. That is, a bending pattern BP may be disposed on the central portion of the first area A1 and another bending pattern BP may be disposed on the central portion of the second area A2. Therefore, a bending pattern BP may be connected to the central portion of the first lower power link line PLL1, and another bending patterns BP may be connected to the central portion of the second lower power link line PLL2.

Therefore, the plurality of first power lines PL1 may include at least two sets of first power lines PL1 equidistant from where the first lower connecting line LP1. That is, the first lower connecting line LP1 connected to a bending pattern BP, is disposed on the central portion of the first area A1 and is connected to the central portion of the first lower power link line PLL1. Thus, the plurality of first power lines PL1 may include at least two sets of first power lines PL1 equidistant from the first lower connecting line LP1. Further, the second lower connecting line LP2 may be connected to the central portion of the second lower power link line PLL2. Thus, the plurality of second power lines PL2 may include at least two sets of second power lines PL2 equidistant from the second lower connecting line LP2. That is, the second lower connecting line LP2 connected to the bending patterns BP is disposed on the central portion of the second area A2. Thus, at least two sets of the plurality of second power lines PL2 may be equidistant from the second lower connecting line LP2.

In addition, the first lower connecting line LP1 and the second lower connecting line LP2 are connected to the central portions of the first lower power link line PLL1 and the second lower power link line PLL2, respectively. This may mean that the first lower connecting line LP1 and the second lower connecting line LP2 are connected to the precise centers of the first lower power link line PLL1 and the second lower power link line PLL2, respectively. Otherwise, this may mean that the first lower connecting line LP1 and the second lower connecting line LP2, which are connected to the first lower power link line PLL1 and the second lower power link line PLL2, respectively, such that each set of the first power lines PL1 are equidistant from the first lower connecting line LP1 and each set of the second power lines PL2 are equidistant from the second lower connecting line LP2.

In addition, if the sum of the widths of the first area A1 and the second area A2 in the first non-active area NA1 is L, the length of the first lower power link line PLL1 and the second lower power link line PLL2, respectively, may be $½ \times L$. Since some of the bending patterns BP are connected to the central portion of the first lower power link line PLL1, power voltage transmitted through those bending patterns BP is transmitted through a point corresponding to ½ of the first lower power link line PLL1. In other words, power voltage is transmitted through a point at a distance of $¼ \times L$ from the boundary between the first area A1 and the second area A2. Then, power voltage is transmitted to both ends (e.g., opposite sides) of the first area A1. Further, since the other bending patterns BP are connected to the central portion of the second lower power link line PLL2, power voltage transmitted through the other bending patterns BP is transmitted through a point corresponding to ½ of the second lower power link line PLL2. In other words, power voltage is transmitted through a point at a distance of $¼ \times L$ from the boundary between the first area A1 and the second area A2. Then, power voltage is transmitted to both ends of the second area A2.

The relationship between the data link lines and the upper power link lines described above, in the second non-active area NA2, will be described with reference to FIG. 2.

Figure 2:
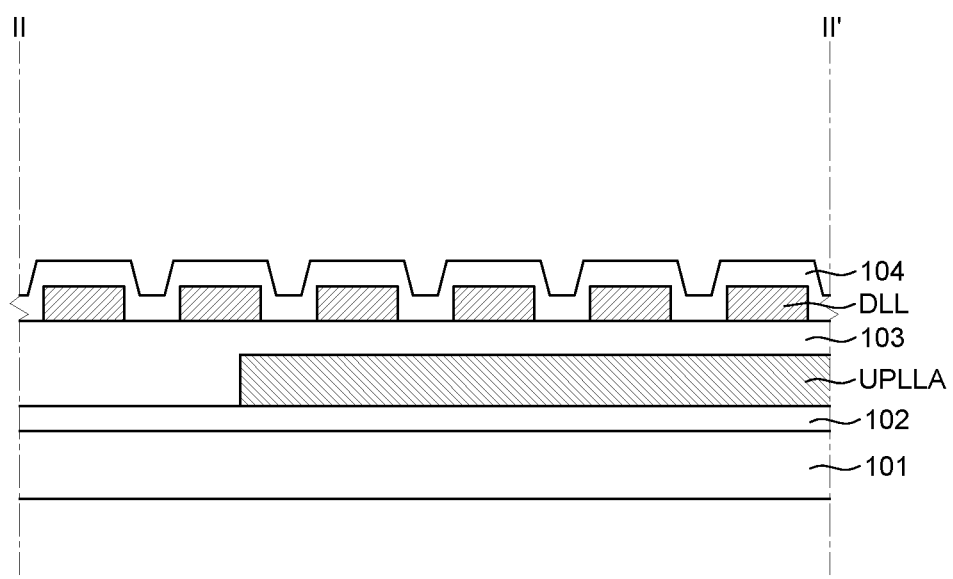
FIG. 2 is a cross-sectional view taken along a line II-II' of FIG. 1 according to an embodiment of the present disclosure.

FIG. 2 is a cross-sectional view taken between II-II' of FIG. 1. FIG. 2 is a cross-sectional view of the second non-active area NA2, specifically, a cross-sectional view of an area including the first portion UPLLA of the upper power link line disposed in the second non-active area NA2.

Referring to FIG. 2, the display device 100 includes the substrate 101, a buffer layer 102, the first portion UPLLA of the upper power link line, an insulating layer 103, a data link line DLL, and a passivation layer 104.

The buffer layer 102 is disposed on the substrate 101. The buffer layer 102 can suppress the penetration of moisture or impurities through the substrate 101. However, the buffer layer 102 may be omitted or selectively disposed depending on the type of substrate 101 and type of thin film transistor disposed in the active area A/A.

The first portion UPLLA of the upper power link line is disposed on the buffer layer 102. As described above, the first portion UPLLA of the upper power link line may be formed of one of a variety of materials used in manufacturing an organic light emitting diode, gate electrode, source electrode, or drain electrode of the thin film transistor in the active area A/A.

The insulating layer 103 is configured to protect the upper power link line. For example, the insulating layer 103 may be a gate insulating layer or an interlayer insulating layer. Further, the insulating layer 103 may comprise a single layer or multiple layers, formed of silicon oxide (SiOx) or silicon nitride (SiNx), but may not be limited thereto.

A plurality of data link lines DLL is disposed on the insulating layer 103. In this instance, only some of the plurality of data link lines DLL overlap the first portion UPLLA of the upper power link line. The plurality of data link lines DLL is configured to transmit data voltage from the driver IC 112 to a plurality of data lines in the active area A/A. The plurality of data link lines DLL is disposed in the non-active area N/A and the plurality of data lines is disposed in the active area A/A. Further, the plurality of data link lines DLL is connected to the driver IC 112 and the plurality of data lines, respectively. The plurality of data link lines DLL and data lines may be formed of one of a variety of materials used in manufacturing an organic light emitting diode, gate electrode, source electrode, or drain electrode of the thin film transistor in the active area A/A. Further, the plurality of data link lines DLL and data lines may be formed as a single layer or in multiple layers. FIG. 2 illustrates that the plurality of data link lines DLL is disposed on the first portion UPLLA of the upper power link line. However, the plurality of data link lines DLL may also be disposed under the first portion UPLLA of the upper power link line.

The passivation layer 104 is disposed on the plurality of data link lines DLL. The passivation layer 104 is an insulating layer configured to protect the data link lines DLL. For example, the passivation layer 104 may comprise a single layer or multiple layers, formed of silicon oxide (SiOx) or silicon nitride (SiNx), but may not be limited thereto.

FIG. 2 illustrates that the passivation layer 104 is disposed on the data link lines DLL. However, other components, such as an organic layer or a planarization layer, may additionally be disposed.

Display devices are being utilized in a variety of applications, such as in monitors, TVs, smartphones, and watches. Studies on creating a display device having a wide display area and a reduced volume and weight are being conducted. The study of reducing bezel sizes in display devices is one of them. Two approaches to reducing the size of a bezel are: bending a non-active area of a substrate and reducing the size of the non-active area itself. As such, studies on reducing the power voltage input area and reducing the number of lines for power voltage transmission are being conducted.

However, in reducing the power voltage input area and the number of lines for power voltage transmission, power voltage drop often occurs due to resistance in the power link line. The power voltage drop causes the transmission of non-uniform power voltage among the plurality of pixels in an active area. For example, a power link line for power voltage transmission may be positioned on a central portion of the non-active area and the power link line in the non-active area extends from this central portion to both ends of the non-active area. In this instance, power voltage transmitted through a power line positioned at the other end of the active area (e.g., at the farthest side) may be lower than the power voltage transmitted through a power line positioned on a central portion of the active area. That is, a power line in the central portion of the active area is supplied with power voltage directly from a power link line positioned on the central portion of the non-active area, whereas a power line positioned on a far end of the active area is supplied with power voltage through a power link line extending from the center to both ends of the non-active area. Therefore, the power voltage transmitted through a power line positioned on the far end of the active area may be lower than power voltage transmitted through a power line positioned on the central portion of the active area. Accordingly, when power voltage is unevenly transmitted to the plurality of pixels in the active area, non-uniformity in brightness may occur, and the reliability of the display device may be decreased.

Accordingly, the display device 100, according to an embodiment of the present disclosure includes a power link line configured to split and transmit power voltage to a first area A1 and a second area A2 of the substrate 101. Further, the display device 100 reduces differences in line resistance caused by the varying lengths of the lines for power voltage transmission, and consequently reduces power voltage drops. In detail, power voltage from the driver IC 112 disposed in the pad area PA is transmitted into the central portion of the second non-active area NA2. Then, the power voltage is transmitted to the central portions of the first area A1 and the second area A2 through the first portion UPLLA and the second portion UPLLB, respectively, of the upper power link line. The power voltage supplied through the central portion of the non-active area N/A is then transmitted to the plurality of power lines, not from the central portion of the active area A/A but from, in one embodiment, points corresponding to ¼ and ¾ of the length of the active area A/A. Therefore, the amount of power voltage drop can be reduced relative to when power voltage is transmitted from the center of the substrate 101 to the edges. Accordingly, the display device 100, according to an embodiment of the present disclosure, uniformly distributes power voltage transmitted into the center of the substrate 101 from the driver IC 112 to several points to reach the active area A/A. Thus, the paths for transmission of power voltage to each power line can be reduced. Therefore, power voltage drop can be minimized, and an image with improved uniform brightness can be displayed.

Figure 3:
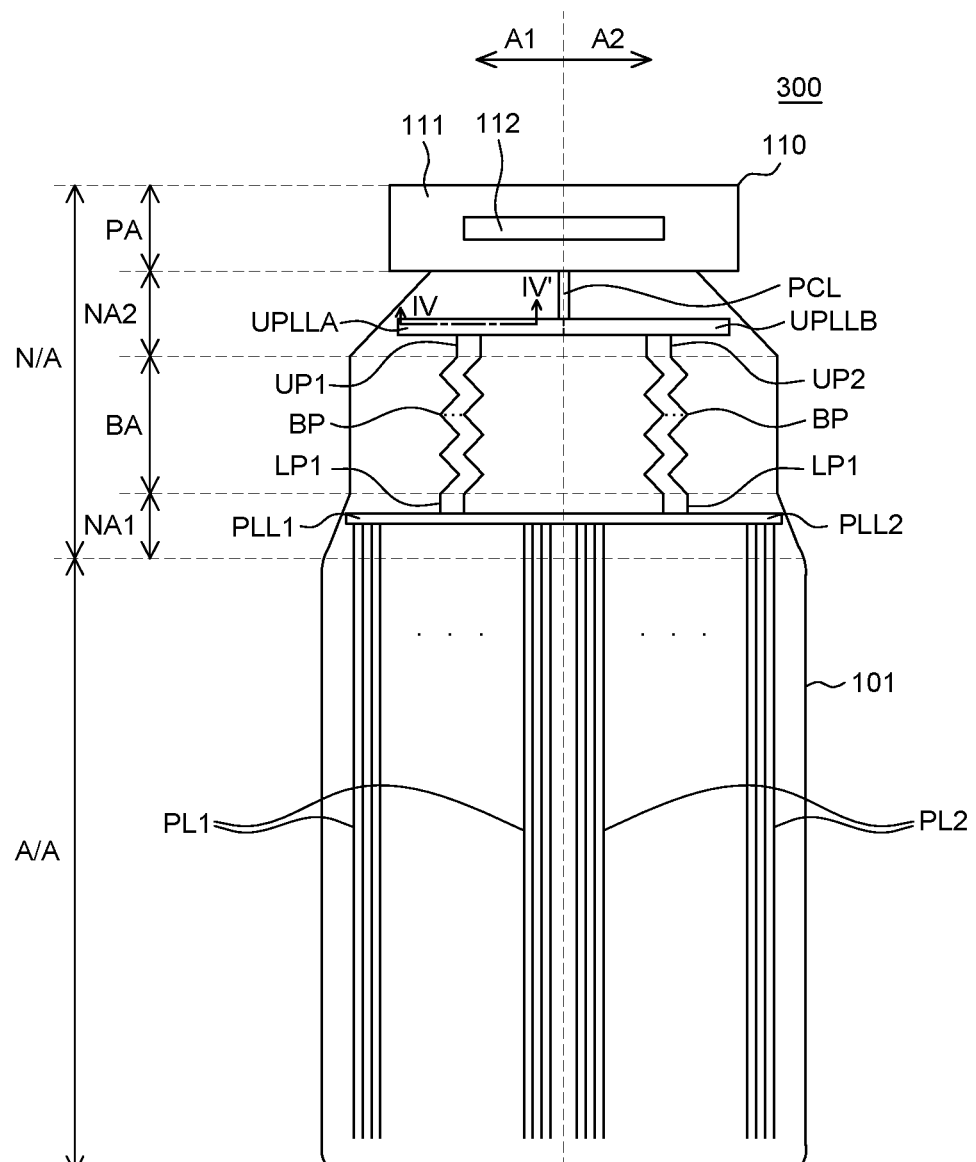
FIG. 3 is a plan view of a display device according to another embodiment of the present disclosure.
Figure 4:
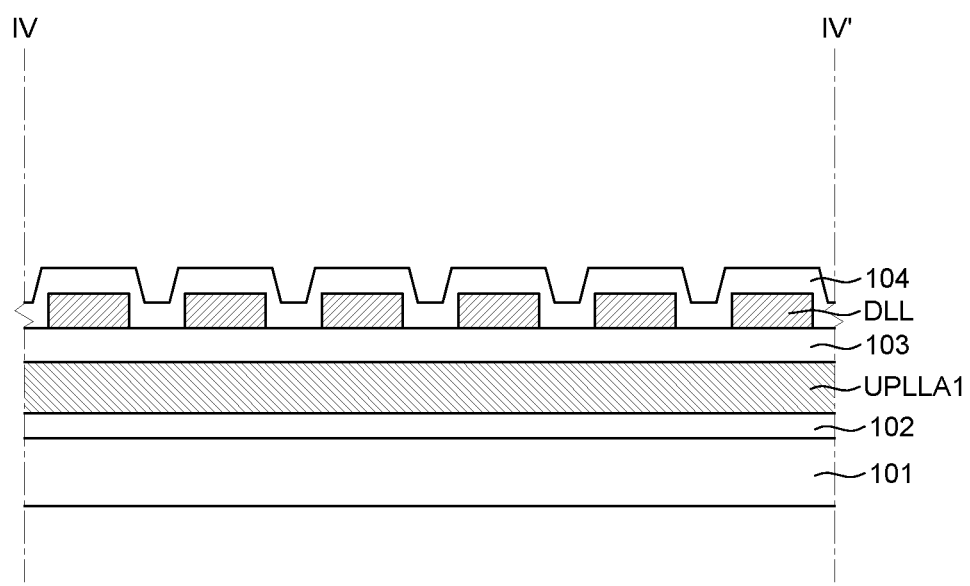
FIG. 4 is a cross-sectional view taken along a line IV-IV' of FIG. 3 according to an embodiment of the present disclosure.

FIG. 3 is a plan view of a display device according to another embodiment of the present disclosure. FIG. 4 is a cross-sectional view taken along a line IV-IV' of FIG. 3. FIG. 4 is a cross-sectional view of the second non-active area NA2 including the first portion UPLLA of the upper power link disposed in the second non-active area NA2. A display device 300 illustrated in FIG. 3 and FIG. 4 is substantially the same in configuration as the display device 100 illustrated in FIG. 1 and FIG. 2, except for the first portion UPLLA and the second portion UPLLB of the upper power link line. Therefore, redundant descriptions thereof will be omitted.

In FIG. 3, the first portion UPLLA of the upper power link line extends to the first area A1 and the second portion UPLLB of the upper power link line extends to the second area A2. However, in this embodiment, the first portion UPLLA and the second portion UPLLB of the upper power link line are extended farther from the center of the second non-active area NA2 to the end of the first area A1 and an end of the second area A2, respectively. Thus, the first upper connecting line UP1 and second upper connecting line UP2 extend, not from the end portions of the first portion UPLLA and the second portion UPLLB of the upper power link line, respectively, rather they extend from the central portions of each corresponding upper power link line (e.g., a center of UPLLA and a center of UPLLB).

Similar to the first portion UPLLA of the upper power link line, the first lower power link line PLL1 also extends to the end (e.g., outer edge) of the first area A1. Similar to the second portion UPLLB of the upper power link line, the second lower power link line PLL2 also extends to the end of the second area A2.

Referring to FIG. 4, the first portion UPLLA of the upper power link line is disposed on the buffer layer 102. Specifically, the first portion UPLLA of the upper power link line and the first lower power link line PLL1 both extend to the end (e.g., outer edge) of the first area A1 and are thus disposed throughout the entire length of the first area A1. Likewise, the second portion UPLLB of the upper power link line and the second lower power link line PLL2 are both disposed throughout the entire length of the second area A2.

The insulating layer 103 and the plurality of data link lines DLL are disposed on the first portion UPLLA of the upper power link line. Further, the first portion UPLLA of the upper power link line overlaps with each of the plurality of data link lines DLL. In other words, all of the data link lines overlap with at least a portion of the power link line (e.g., UPLLA and UPLLB). For example, some or all of the data link lines can cross the upper power link line, in order to equalize or uniformly distribute potential interference or parasitic capacitance across the data link lines.

In the display device 300, according to another embodiment of the present disclosure, the first portion UPLLA and second portion UPLLB of the upper power link line extend from the center of the second non-active area NA2 to the ends (e.g., opposite sides or outer edges) of the first area A1 and second area A2, respectively. This minimizes deviations caused by RC loads for data voltage. Further, in the first non-active area NA1, the first lower power link line PLL1 and second lower power link line PLL2 extend throughout the entire length of the first area A1 and second area A2, respectively. Thus, it is possible to minimize deviations caused by RC loads for data voltage. As described above, when the data link lines DLL overlap the upper power link line and the lower power link line, parasitic capacitance may be generated between the data link lines DLL and the upper power link line, and/or between the data link lines DLL and the lower power link line. Therefore, RC loads may be generated by data voltage transmitted to the data link lines DLL. However, the upper power link line and the lower power link line could be designed to overlap with only some of the plurality of data link lines DLL. In this instance, different RC loads may be generated for data voltage transmitted through data link lines DLL overlapping the upper power link line and the lower power link line, as opposed to when they do not overlap the upper power link line and the lower power link line, potentially creating an RC load deviation between the data link lines DLL. In the display device 300 according to another embodiment of the present disclosure, both the first portion UPLLA and the second portion UPLLB of the upper power link line extend from the center of the second non-active area NA2 to the ends (e.g., outer edges) of the first area A1 and second area A2, respectively. Thus, the first portion UPLLA of the upper power link line may overlap all of the data link lines DLL disposed in the first area A1. Further, the second portion UPLLB of the upper power link line may overlap all of the data link lines DLL disposed in the second area A2. Also, in the first non-active area NA1, the first lower power link line PLL1 and the second lower power link line PLL2 extend to both ends (e.g., opposite sides) of the first area A1 and second area A2, respectively. Thus, the first lower power link line PLL1 may overlap all of the data link lines DLL disposed in the first area A1, and the second lower power link line PLL2 may overlap all of the data link lines DLL disposed in the second area A2. Therefore, in the display device 300, according to another embodiment of the present disclosure, deviations in RC loads transmitted through the data link lines DLL can be reduced. Thus, data voltage delays may occur equally in each of the data link lines DLL, reducing deviations caused by such.

Figure 5:
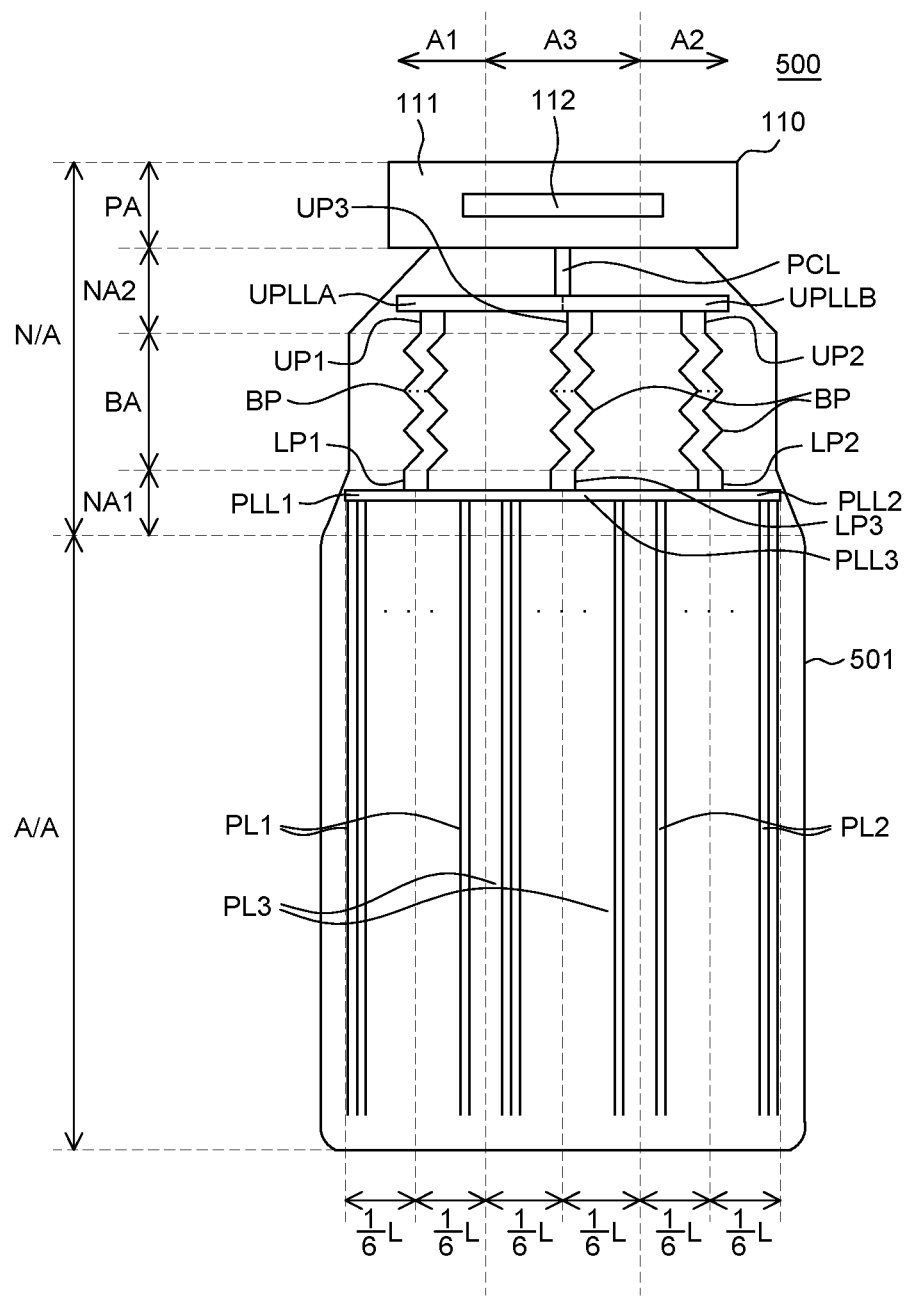
FIG. 5 to FIG. 9 are plan views of a display device according to embodiments of the present disclosure.

FIG. 5 is a plan view of a display device according to yet another embodiment of the present disclosure. The display device 500 illustrated in FIG. 5 is substantially the same in configuration as the display device 300 illustrated in FIG. 3 and FIG. 4, except that a third area A3, third upper connecting line UP3, third lower connecting line LP3, third lower power link line PLL3, and third plurality of power lines PL3 are further included. Therefore, redundant descriptions thereof will be omitted.

Referring to FIG. 5, a substrate 501 of the display device 500 includes a first area A1, second area A2, and third area A3. The first area A1, second area A2, and third area A3 may be defined by dividing the length of the substrate 501 along a longitudinal direction. For example, if the substrate 501 is divided into three parts in a longitudinal direction: the first area A1 refers to the left area of the substrate 501, including the corresponding parts of both the active area A/A and the non-active area N/A; the second area A2 refers to the right area of the substrate 501, including the corresponding parts of both the active area A/A and the non-active area N/A; and the third area A3 refers to the central area of the substrate 501, including the corresponding parts of both the active area A/A and the non-active area N/A.

The upper power link line includes a first portion UPLLA, extending from the center of the third area A3 through the first area A1, and a second portion UPLLB, extending from the center of the third area A3 through the second area A2. In other words, the first portion UPLLA and second portion UPLLB each extend to the end of the first area A1 and second area A2, respectively, from the center of the third area A3.

A plurality of upper connecting lines is disposed in the second non-active area NA2 and connects the first portion UPLLA and second portion UPLLB of the upper power link line with the plurality of bending patterns BP disposed in the bending area BA. The plurality of upper connecting lines includes the first upper connecting line UP1, second upper connecting line UP2, and third upper connecting line UP3. The first upper connecting line UP1 refers to a line extending from the first portion UPLLA disposed in the first area A1 toward the bending area BA. The second upper connecting line UP2 refers to a line extending from the second portion UPLLB disposed in the second area A2 toward the bending area BA. The third upper connecting line UP3 refers to a line extending from the first portion UPLLA and/or the second portion UPLLB disposed in the third area A3 toward the bending area BA.

A bending pattern BP in the bending area BA is connected to each of the upper connecting lines in the bending area BA. In more detail, a bending pattern BP is connected to the first upper connecting line UP1, which is extended from the first portion UPLLA in the first area A1. Another bending pattern BP is connected to the second upper connecting line UP2, which is extended from the second portion UPLLB in the second area A2. A third bending pattern BP is connected to the third upper connecting line UP3, which is extended from the first portion UPLLA and/or the second portion UPLLB in the third area A3. That is, the plurality of bending patterns BP in the bending area BA, some are disposed in the first area A1, some are disposed in the second area A2, and others are disposed in the third area A3.

A lower connecting line, disposed in the first non-active area NA1, is connected to each bending pattern BP, respectively. In more detail, the plurality of lower connecting lines includes a first lower connecting line LP1, a second lower connecting line LP2, and a third lower connecting line LP3. In the first non-active area NA1, the first lower connecting line LP1 is disposed in the first area A1, the second lower connecting line LP2 is disposed in the second area A2, and the third lower connecting line LP3 is disposed in the third area A3. Accordingly, the first lower connecting line LP1 is connected to the bending pattern BP disposed in the first area A1, the second lower connecting line LP2 is connected to the bending pattern BP disposed in the second area A2, and the third lower connecting line LP3 is connected to the bending pattern BP disposed in the third area A3.

The first lower power link line PLL1, second lower power link line PLL2, and third lower power link line PLL3 are connected to the first lower connecting line LP1, second lower connecting line LP2, and third lower connecting line LP3, respectively. In more detail, the first lower power link line PLL1 is connected to the first lower connecting line LP1. The second lower power link line PLL2 is connected to the second lower connecting line LP2. The third lower power link line PLL3 is connected to the third lower connecting line LP3. That is, in the first non-active area NA1, the first lower power link line PLL1 is disposed in the first area A1, the second lower power link line PLL2 is disposed in the second area A2, and the third lower power link line PLL3 is disposed in the third area A3. Herein, the first lower power link line PLL1, the second lower power link line PLL2, and the third lower power link line PLL3 may extend throughout the length of the first area A1, second area A2, and third area A3, respectively. Further, the first lower power link line PLL1, second lower power link line PLL2, and third lower power link line PLL3, each extending throughout the length of the first area A1, second area A2, and third area A3, respectively, may connect to each other at the boundary between each of the areas. That is, the first lower power link line PLL1, the second lower power link line PLL2, and the third lower power link line PLL3 may be connected in a single line (e.g., PLL1, PLL2, and PLL3 can form a single power line).

A plurality of power lines is disposed in the active area A/A, and are connected to the first lower power link line PLL1, second lower power link line PLL2, and third lower power link line PLL3. The plurality of power lines includes the first power lines PL1, the second power lines PL2, and the third power lines PL3. The first power lines PL1 are disposed in the first area A1 and connected to the first lower power link line PLL1. The second power lines PL2 are disposed in the second area A2 and connected to the second lower power link line PLL2. The third power lines PL3 are disposed in the third area A3 and connected to the third lower power link line PLL3.

In the above-described configuration of the power link lines, power voltage from the driver IC 112 may be sequentially transmitted to the pad connecting line PCL, the first portion UPLLA of the upper power link line, the first upper connecting line UP1, a bending pattern BP, the first lower connecting line LP1, the first lower power link line PLL1, and the first power lines PL1 in sequence, to transmit power voltage to pixels disposed in the first area A1. Power voltage from the driver IC 112 may also be sequentially transmitted to the pad connecting line PCL, the second portion UPLLB of the upper power link line, the second upper connecting line UP2, a bending pattern BP, the second lower connecting line LP2, the second lower power link line PLL2, and the second power lines PL2, to transmit power voltage to pixels disposed in the second area A2. Power voltage from the driver IC 112 may yet also be sequentially transmitted to the pad connecting line PCL, the first portion UPLLA and the second portion UPLLB of the upper power link line, the third upper connecting line UP3, a bending pattern BP, the third lower connecting line LP3, the third lower power link line PLL3, and the third power lines PL3 in sequence, to transmit power voltage to pixels disposed in the third area A3.

In the embodiment of the present disclosure as illustrated in display device 500, the substrate 501 is divided into the first area A1, the second area A2, and the third area A3. Further, the power link lines and power lines corresponding to the respective areas are disposed to transmit power voltage to pixels in their respective areas. However, the present disclosure is not limited thereto. In this instance, the substrate 501 may be divided into three or more areas and power voltage may be similarly supplied to each of those areas. Herein, the height of a neutral plane is designed to reduce stress applied to each line during bending of the bending area BA. To facilitate the design of the neutral plane, the plurality of bending patterns BP and the plurality of data link lines may be disposed on the same layer. In this instance, if the number of bending patterns BP disposed on the substrate 501 is increased, space for the plurality of data link lines is reduced. Additionally, as the resolution of a display device increases, the number of data lines and data link lines connected to the data lines also increase. Therefore, as high-resolution display devices require sufficient space for more data link lines, the space for bending patterns BP in the bending area BA may become more limited. In such high-resolution display devices, the number of areas on the substrate 501 and the layout of power link lines can be determined based on a variety of factors, such as the resolution of the display device, the width of the bending area BA, the width of the data link lines, and the like. Accordingly, in some embodiments, the substrate 501 may have three or more areas.

In addition, if the sum of the widths of the first area A1, second area A2, and third area A3 in the first non-active area NA1 is L, the first lower power link line PLL1, second lower power link line PLL2, and third lower power link line PLL3 may each have a length of $\frac{1}{3} \times L$. Since some of the plurality of bending patterns BP are connected to the central portion of the first lower power link line PLL1, power voltage transmitted through those bending patterns BP is transmitted through a point corresponding to $\frac{1}{2}$ of the length of the first lower power link line PLL1. In other words, power voltage is transmitted to the first lower power link line PLL1 at a point at a distance of $\frac{1}{6} \times L$ from the boundary between the first area A1 and the third area A3. Then, power voltage is transmitted to both ends of the first area A1. Likewise, since some of the plurality of bending patterns BP are connected to the central portion of the second lower power link line PLL2, the power voltage transmitted through those bending patterns BP is transmitted through a point corresponding to $\frac{1}{2}$ of the length of the second lower power link line PLL2. In other words, power voltage is transmitted to the second lower power link line PLL2 at a point at a distance of $\frac{1}{6} \times L$ from the boundary between the second area A2 and the third area A3. Then, power voltage is transmitted to both ends of the second area A2. Also likewise, since some of the plurality of bending patterns BP are connected to the central portion of the third lower power link line PLL3, the power voltage transmitted through those bending patterns BP is transmitted through a point corresponding to $\frac{1}{2}$ of the length of the third lower power link line PLL3. In other words, power voltage is transmitted to the third lower power link line PLL3 at a point at a distance of $\frac{1}{6} \times L$ from the boundary between the third area A3 and the first area A1. Then, power voltage is transmitted to both ends of the third area A3.

Accordingly, the display device 500 according to another embodiment of the present disclosure includes a power link line configured to dividedly transmit power voltage to the first area A1, second area A2, and third area A3 of the substrate 501. The display device 500 reduces the differences in line resistance caused by the varying lengths of the lines for power voltage transmission. Thus, it is possible to minimize power voltage drop. The power voltage supplied through the central portion of the second non-active area NA2 is transmitted to the plurality of power lines from, for example, points corresponding to $\frac{1}{6}$, $\frac{1}{2}$, and $\frac{5}{6}$ of the length of the active area A/A. Therefore, the amount of power voltage drop can be reduced relative to when power voltage is transmitted from a single central portion to both ends of the substrate 501.

Accordingly, the display device 500 according to another embodiment of the present disclosure uniformly distributes power voltage supplied into the central portion of the substrate 501 to several points until the power voltage reaches the active area A/A from the driver IC 112, reducing the distance power voltage must travel to each power line. Power voltage drop can be minimized and an image with more uniform brightness can be displayed.

Figure 6:
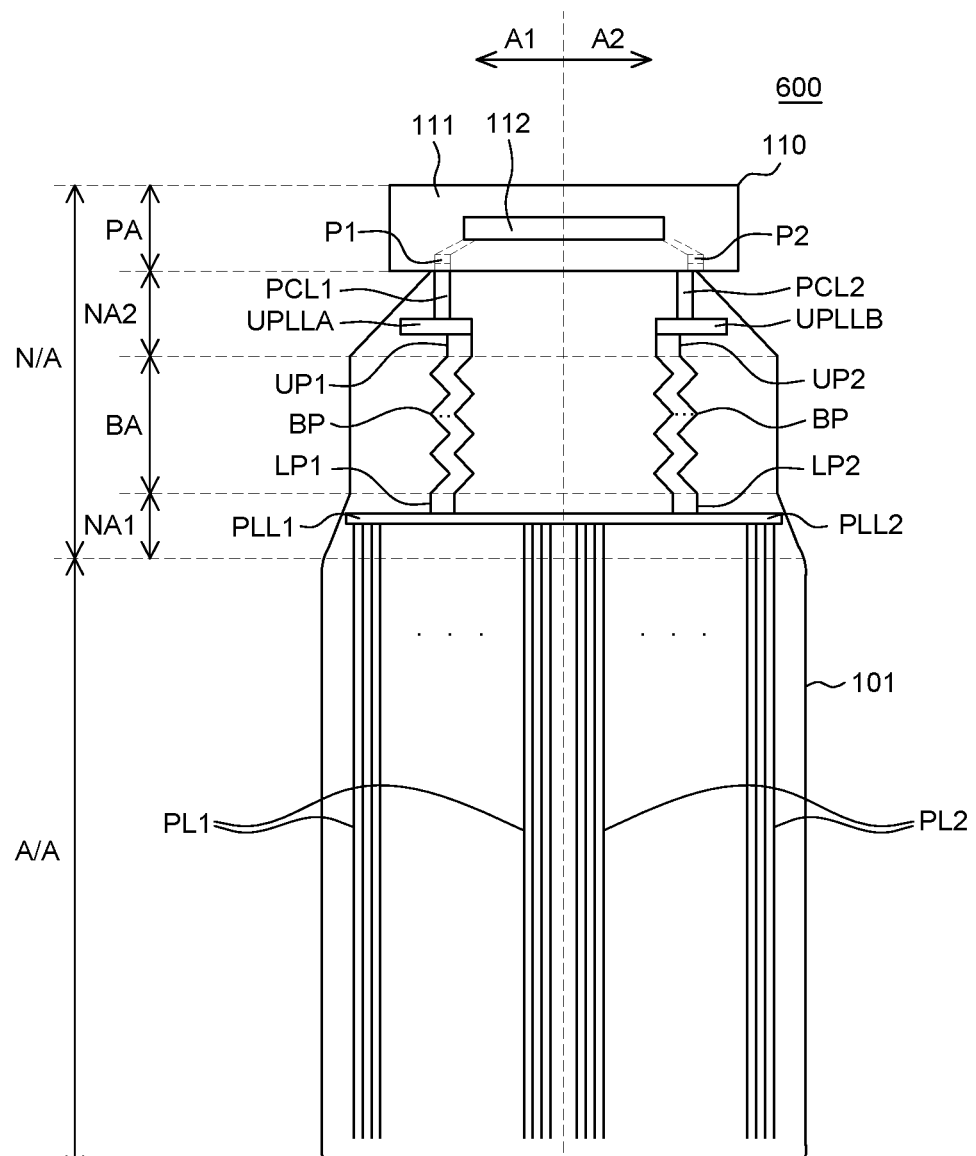

FIG. 6 is a plan view of a display device according to still another embodiment of the present disclosure. The display device 600 illustrated in FIG. 6 is substantially the same in configuration as the display device 100 illustrated in FIG. 1 and FIG. 2, except for the arrangement of the pad connecting line, the first portion UPLLA, and the second portion UPLLB of the upper power link line. Therefore, redundant descriptions thereof will be omitted.

Referring to FIG. 6, the driver IC 112 disposed on the flexible film 110 transmits power voltage to the power link line through a first pad P1 and second pad P2. The first pad P1 and second pad P2 may be configured to output power voltage. The flexible film 110 includes a plurality of pads configured to output power voltage, data voltage, and the like. The first pad P1 and the second pad P2 may be the outermost pads among the plurality of pads disposed on the flexible film 110. Herein, FIG. 6 illustrates only the first pad P1 and the second pad P2, among the plurality of pads, to which power voltage is output from the driver IC 112, for convenience in explanation.

The pad connecting lines in the second non-active area NA2 include a first pad connecting line PCL1 disposed in the first area A1 and a second pad connecting line PCL2 disposed in the second area A2. Further, the first pad connecting line PCL1 extends from the first pad P1 in the pad area PA into the second non-active area NA2. The second pad connecting line PCL2 extends from the second pad P2 in the pad area PA into the second non-active area NA2. That is, among the plurality of pads disposed on the flexible film 110, the first pad connecting line PCL1 and the second pad connecting line PCL2 are connected to the outermost first and second pads P1 and P2, respectively. Further, each of the first pad connecting line PCL1 and the second pad connecting line PCL2 are disposed at the ends (e.g., near the outer edges) of the pad area PA.

FIG. 6 illustrates that the pad connecting line includes the two pad connecting lines, that is, the first pad connecting line PCL1 and the second pad connecting line PCL2. However, the number of pad connecting lines may be increased depending on the number of pads to which power voltage is output from the driver IC 112. Also, the positions of pad connecting lines may vary depending on the layout of pads to which a power voltage is output from the driver IC 112 and may not be limited thereto what is depicted herein.

The upper power link line includes the first portion UPLLA and the second portion UPLLB. The first portion UPLLA is disposed in the first area A1 of the second non-active area NA2. The second portion UPLLB is disposed in the second area A2. Specifically, the upper power link line includes the first portion UPLLA and second portion UPLLB, each extending into the first area A1 and second area A2, respectively, from each end of the second non-active area NA2. In this instance, the first portion UPLLA may extend from one end of the second non-active area NA2 to the central portion of the first area A1. Further, the second portion UPLLB may extend from the other end of the second non-active area NA2 to the central portion of the second area A2.

The upper power link line is connected to the pad connecting line. In more detail, the first portion UPLLA of the upper power link line is connected to the first pad connecting line PCL1 at the one end of the second non-active area NA2. The second portion UPLLB of the upper power link line is connected to the second pad connecting line PCL2 at the other end of the second non-active area NA2.

Each upper power link line is connected to a bending pattern BP. In more detail, the first portion UPLLA of the upper power link line is connected to some of the plurality of bending patterns BP through the first upper connecting line UP1. The second portion UPLLB of the upper power link line is connected to some of the plurality of bending patterns BP through the second upper connecting line UP2. That is, an end portion of the first portion UPLLA of the upper power link line is connected to the first upper connecting line UP1 on the central portion of the first area A1. Further, an end portion of the second portion UPLLB of the upper power link line is connected to the second upper connecting line UP2 on the central portion of the second area A2.

In the display device 600 according to another embodiment of the present disclosure, power voltage is transmitted from the driver IC 112 disposed in the pad area PA to each of both ends (e.g., opposite sides) of the non-active area N/A. The power voltage output point of the driver IC 112 of the display device 600 may be changed in various ways depending on the model and design of the driver IC 112. When the power voltage output point of the driver IC 112 is changed, the layout or disposition of pad connecting lines may be changed accordingly. Even in this instance, the first portion UPLLA of the upper power link line connected to the first pad connecting line PCL1 can be extended to the central portion of the first area A1. Further, the second portion UPLLB of the upper power link line connected to the second pad connecting line PCL2 can be extended to the central portion of the second area A2. Therefore, the display device 600 according to another embodiment of the present disclosure can distribute power voltage from the driver IC 112 to the active area A/A through many points, regardless of any changes in the points from which power voltage is transmitted due to varying models and designs of the driver IC 112. The path for transmission of power voltage to each power line can be reduced in this manner. Therefore, power voltage drop can be reduced and an image with uniform brightness can be displayed. Since the layout or disposition of the power link line can be freely adjusted according to the kind and design of the driver IC 112, there is a degree of freedom in design.

Further, power voltage can be dividedly transmitted through the first pad connecting line PCL1 and the second pad connecting line PCL2, with each respectively disposed at opposite ends of the second non-active area NA2. It is possible to improve heating and reduce any deformations of the display device 600 caused by excessive current, reducing the degradation of the display device 600, in this manner.

Figure 7:
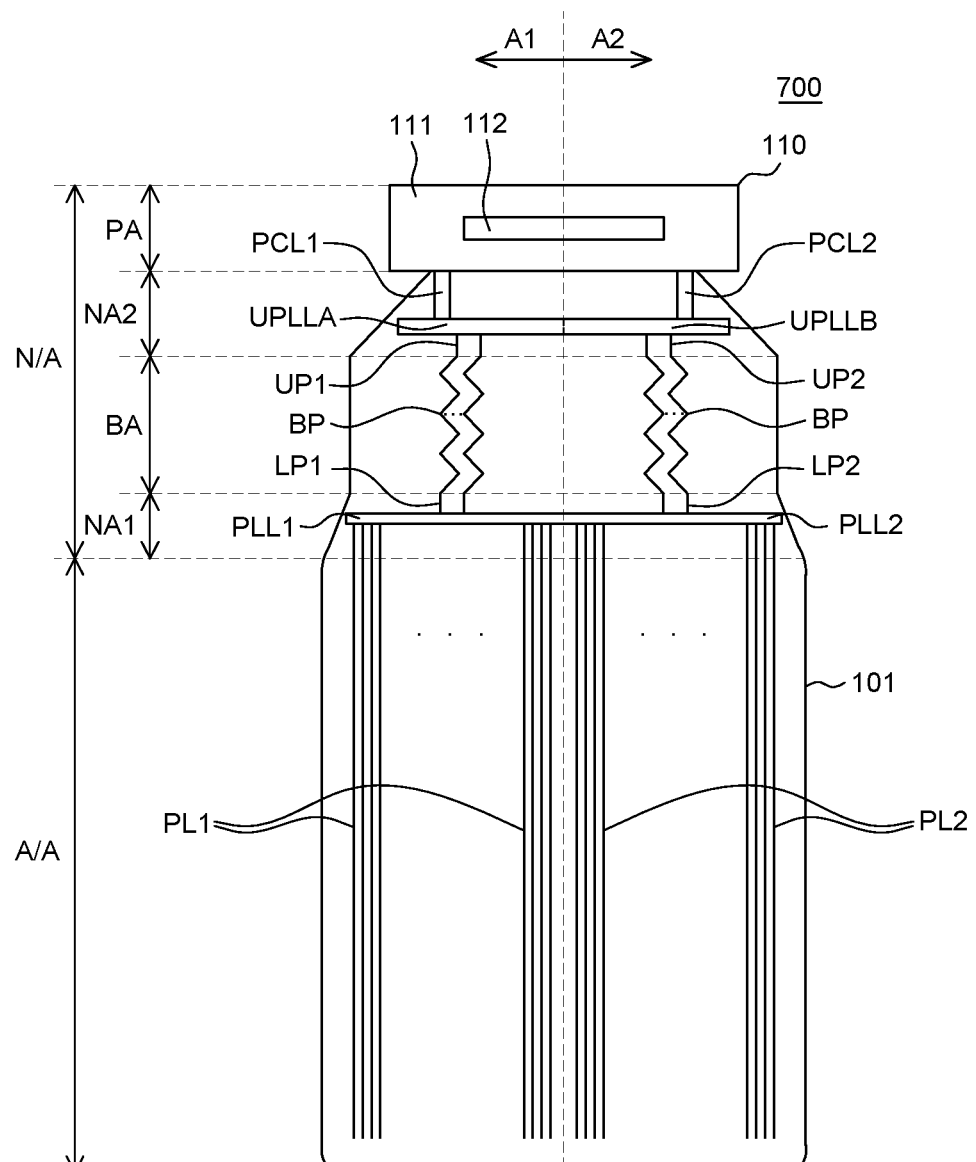

FIG. 7 is a plan view of a display device according to another embodiment of the present disclosure. The display device 700 illustrated in FIG. 7 is substantially the same in configuration as the display device 600 illustrated in FIG. 6, except for the first portion UPLLA and the second portion UPLLB of the upper power link line. Therefore, redundant descriptions thereof will be omitted.

Referring to FIG. 7, the first portion UPLLA of the upper power link line is disposed in the first area A1 of the second non-active area NA2. The second portion UPLLB of the upper power link line is disposed in the second area A2. Herein, the first portion UPLLA and second portion UPLLB of the upper power link line each extend to the boundary between the first area A1 and the second area A2, from each end of the second non-active area NA2 and the second portion UPLLB also extends to the boundary between the first area A1 and the second area A2. Thus, the first portion UPLLA and the second portion UPLLB of the upper power link line are connected to each other at this boundary. Thus, the first upper connecting line UP1 and the second upper connecting line UP2 may extend from the central portions of the first portion UPLLA and the second portion UPLLB, respectively, of the upper power link line. The first portion UPLLA and the second portion UPLLB are disposed throughout the length of the second non-active area NA2.

In the first non-active area NA1, the first lower power link line PLL1 extends to both ends (e.g., opposite sides) of the first area A1, and the second lower power link line PLL2 extends to both ends of the second area A2. That is, like the first portion UPLLA and the second portion UPLLB in the second non-active area NA2, the first lower power link line PLL1 and the second lower power link line PLL2 are disposed throughout the entire length of the first non-active area NA1.

In the display device 700 according to another embodiment of the present disclosure, the first portion UPLLA and the second portion UPLLB of the upper power link line extend from the respective opposite ends of the second non-active area NA2 to the boundary between the first area A1 and the second area A2. This makes it possible to minimize any deviations caused by an RC load for data voltage. In more detail, the first portion UPLLA of the upper power link line extends from one end of the second non-active area NA2 to the boundary between the first area A1 and the second area A2 and may overlap the data link lines disposed in the first area A1. Further, the second portion UPLLB of the upper power link line extends from the other end of the second non-active area NA2 to the boundary between the first area A1 and the second area A2 and may overlap the data link lines disposed in the second area A2. Moreover, the first lower power link line PLL1 and the second lower power link line PLL2 are also disposed throughout the length of the entire first non-active area NA1. Thus, the first lower power link line PLL1 and the second lower power link line PLL2 may overlap with all of the data link lines disposed in the first non-active area NA1. Therefore, in the display device 700 according to another embodiment of the present disclosure, a deviation in an RC load transmitted through the data link lines can be reduced. Thus, any data voltage delay may occur equally in all of the data link lines. Therefore, it is possible to reduce deviations caused by the data voltage delays.

Figure 8:
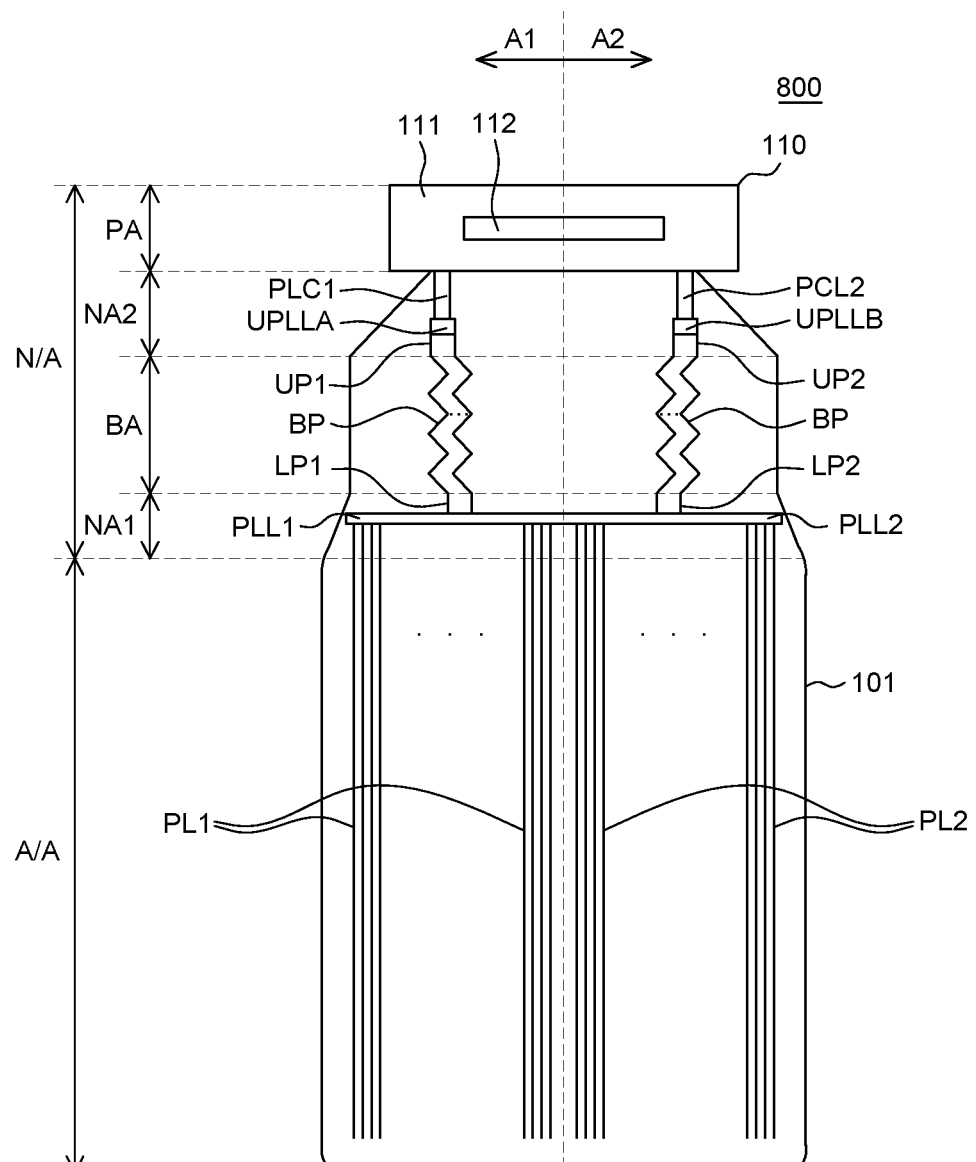

FIG. 8 is a plan view of a display device according to another embodiment of the present disclosure. A display device 800 illustrated in FIG. 8 is substantially the same in configuration as the display device 600 illustrated in FIG. 6, except for the first portion UPLLA and the second portion UPLLB of the upper power link line and the layout of the plurality of bending patterns BP. Therefore, redundant descriptions thereof will be omitted.

Referring to FIG. 8, the first pad connecting line PCL1 and the second pad connecting line PCL2 are respectively disposed on opposite ends of the second non-active area NA2. Further, the first portion UPLLA of the upper power link line is disposed in the first area A1 of the second non-active area NA2. The second portion UPLLB of the upper power link is disposed in the second area A2 of the second non-active area NA2. Herein, the first portion UPLLA of the upper power link line is connected to the first pad connecting line PCL1 along the same line. The second portion UPLLB is connected to the second pad connecting line PCL2 along the same line.

That is, like the first pad connecting line PCL1 and the second pad connecting line PCL2, the first portion UPLLA and the second portion UPLLB may be disposed on one end of the first area A1 and the other end of the second area A2, that is, on opposite ends of the second non-active area NA2, respectively.

The upper power link line is connected to the plurality of bending patterns BP. Specifically, the first portion UPLLA of the upper power link line is connected to a bending pattern BP through the first upper connecting line UP1. The second portion UPLLB of the upper power link line is connected to a bending pattern BP through the second upper connecting line UP2. For example, some in the plurality of bending patterns BP are connected to the first pad connecting line PCL1, the first portion UPLLA and the first upper connecting line UP1 disposed on one end of the first area A1. Further, the others in the plurality of bending patterns BP are connected to the second pad connecting line PCL2, the second portion UPLLB and the second upper connecting line UP2 disposed on one end of the second area A2. Therefore, the plurality of bending patterns BP connected to the first upper connecting line UP1 and the second upper connecting line UP2 may be disposed on the ends of the non-active area N/A, that is, opposite ends of the bending area BA.

In the display device 800 according to another embodiment of the present disclosure, power voltage is transmitted from the driver IC 112 disposed in the pad area PA to each end of the non-active area N/A. Further, the power link line for power voltage transmission is disposed along a straight line to minimize the length of each line. Specifically, the first pad connecting line PCL1 and the second pad connecting line PCL2 are disposed on opposite ends of the second non-active area NA2. Further, the first portion UPLLA of the upper power link line, the first upper connecting line UP1 and a bending pattern BP are connected straight to the first pad connecting line PCL1, and their respective centers can disposed along a same straight imaginary line. Also, the second portion UPLLB of the upper power link line, the second upper connecting line UP2 and a bending pattern BP are connected straight to the second pad connecting line PCL2, and their respective centers can disposed along a same straight imaginary line. Therefore, in the display device 800 according to another embodiment of the present disclosure, the path for power voltage transmission from the driver IC 112 to the active area A/A can be reduced. Therefore, power voltage drop can be reduced and an image with uniform brightness can be displayed.

Figure 9:
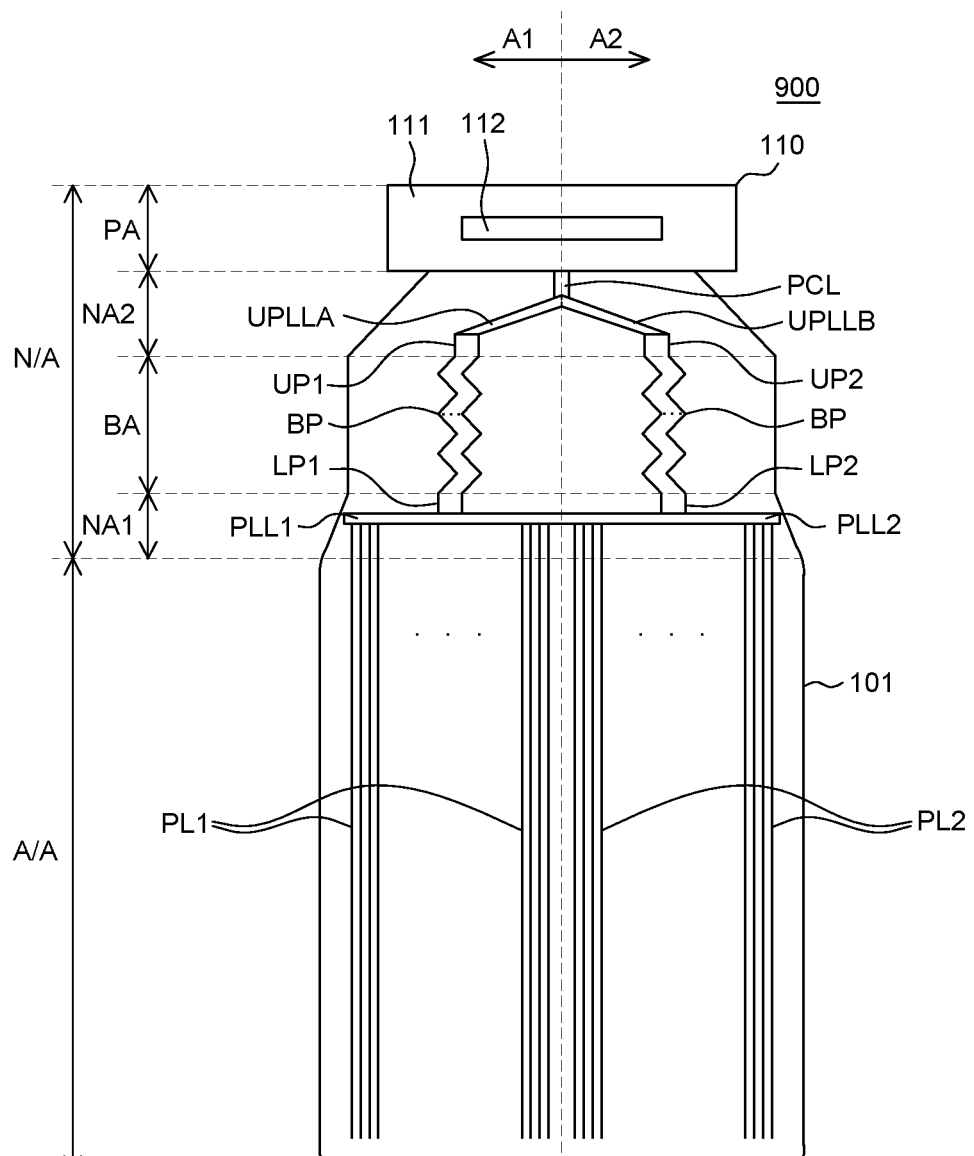

FIG. 9 is a plan view of a display device according to another embodiment of the present disclosure. A display device 900 illustrated in FIG. 9 is substantially the same in configuration as the display device 100 illustrated in FIG. 1 and FIG. 2, except for the first portion UPLLA and the second portion UPLLB of the upper power link line. Therefore, redundant descriptions thereof will be omitted.

Referring to FIG. 9, the upper power link line includes the first portion UPLLA disposed in the first area A1 and the second portion UPLLB disposed in the second area A2. The first portion UPLLA and the second portion UPLLB of the upper power link line are both connected to a single pad connecting line PCL. Further, the first portion UPLLA and the second portion UPLLB of the upper power link line extend to the central portion of the first area A1 and the central portion of the second area A2, respectively, in the second non-active area NA2.

The upper power link line is connected to a plurality of bending patterns BP. Specifically, the first portion UPLLA of the upper power link line is connected to a bending pattern BP through the first upper connecting line UP1. The second portion UPLLB of the upper power link line is connected to a bending pattern BP through the second upper connecting line UP2. In this instance, some in the plurality of bending patterns BP are connected to the first portion UPLLA of the upper power link line through the first upper connecting line UP1. Further, others in the plurality of bending patterns BP are connected to the second portion UPLLB of the upper power link line through the second upper connecting line UP2.

The first portion UPLLA and the second portion UPLLB of the upper power link line may be configured along the shortest possible distance between the pad connective line PCL and each of the first upper connecting line UP1 and the second upper connecting line UP2, respectively. That is, the first portion UPLLA and the second portion UPLLB of the upper power link line may be disposed diagonally in the second non-active area NA2.

In the display device 900 according to another embodiment of the present disclosure, power voltage is transmitted from the driver IC 112 disposed in the pad area PA to the central portions of the non-active area N/A. The power voltage output point of the driver IC 112 of the display device 900 may be changed in various ways depending on the model and design of the driver IC 112. When the power voltage output point of the driver IC 112 is changed, the layout of the pad connecting lines may be changed accordingly. In this instance, the first portion UPLLA and the second portion UPLLB of the upper power link line connect to the pad connecting line PCL and extend to the central portions of the first area A1 and the second area A2, respectively. The first portion UPLLA and the second portion UPLLB of the upper power link line extend to the central portions of the first area A1 and second area A2, respectively, and are each connected to a bending pattern BP respectively disposed on the central portions of the first area A1 and the second area A2. Herein, the first portion UPLLA and the second portion UPLLB can connect the pad connecting line PCL disposed on the central portion of the non-active area N/A, that is, at the boundary between the first area A1 and the second area A2, to the plurality of bending patterns BP with the shortest distance. This minimizes the length of the power link lines configured to transmit power voltage transmitted from the center of the non-active area N/A to the central portions of the first area A1 and the second area A2, respectively. Thus, as the length of the power link line is reduced, resistance in the power link line can be decreased. Also, power voltage drop can also be reduced. Therefore, the display device 900 according to still another embodiment of the present disclosure can distribute power voltage transmitted through the center of the substrate 101 to many points in order to transmit power voltage to the active area A/A from the driver IC 112. Also, the display device 900 can reduce the path for the transmission of the power voltage. Therefore, power voltage drop can be reduced and an image with uniform brightness can be displayed.

The embodiments of the present disclosure can also be described as follows below.

According to an aspect of the present disclosure, there is provided a display device. The display device includes a substrate including an active area with a plurality of pixels and a non-active area adjacent to the active area. The display device further includes a plurality of power lines, including a plurality of both first power lines and second power lines, disposed in the active area and configured to transmit power voltage to the plurality of pixels. The display device further includes a power link line disposed in the non-active area, including a lower power link line connected to the plurality of power lines, a first lower connecting line extending from the lower power link line, and a second lower connecting line extending from the lower power link line. The plurality of first power lines includes at least two sets of first power lines at the same distance from the first lower connecting line. The plurality of second power lines includes at least two sets of second power lines at the same distance from the second lower connecting line.

The non-active area may include a first non-active area in which the lower power link line is disposed, a bending area adjacent to the first non-active area, a second non-active area adjacent to the bending area, and a pad area adjacent to the second non-active area. The substrate may include a first area in which the plurality of first power lines and the first lower connecting line are disposed, and a second area in which the plurality of second power lines and the second lower connecting line are disposed. The lower power link line may include a first lower power link line extended to the first area and a second lower power link line extended to the second area. The first lower connecting line and the second lower connecting line may be extended from the first lower power link line and the second lower power link line, respectively, toward the bending area.

One of the first area and the second area may be a left area and the other may be a right area.

The first lower power link line may extend to both ends (e.g., opposite sides) of the first area, and the second lower power link line may extend to both ends of the second area. The first lower power link line and the second lower power link line may be connected at the boundary between the first area and the second area.

The power link line may include a plurality of bending patterns disposed in the bending area and connected to the first lower connecting line and the second lower connecting line. The power link line may further include an upper power link line disposed in the second non-active area. The power link line may further include an upper connecting line disposed in the second non-active area and connect the bending patterns to the upper power link line.

The upper power link line may include a first portion extending into the first area and a second portion extending into the second area.

The first portion and second portion of the upper power link line may extend to a central portion of the first area and a central portion of the second area, respectively.

Some of the plurality of bending patterns may extend to the first lower connecting line from an end of the first portion of the upper power link line. The other bending patterns among the plurality of bending patterns may extend to the second lower connecting line from an end of the second portion of the upper power link line.

The first portion and the second portion of the upper power link line may extend to the ends of the first area and second area, respectively.

The display device may further include a plurality of data lines disposed in the active area and configured to transmit a data signal to the plurality of pixels. The display device may further include a plurality of data link lines disposed in the non-active area connected to the plurality of data lines. The first portion of the upper power link line may overlap all of the data link lines disposed in the first area among the plurality of data link lines. The second portion of the upper power link line may also overlap all of the data link lines disposed in the second area among the plurality of data link lines.

The first lower power link line may overlap all of the data link lines disposed in the first area. The second lower power link line may overlap all of the data link lines disposed in the second area.

The plurality of power lines may further include a plurality of third power lines disposed in the active area and configured to transmit power voltage to the plurality of pixels. The power link line may further include a third lower power link line disposed in the non-active area, connected to the plurality of third power lines. The substrate may further include a third area in which the plurality of third power lines and the third lower power link line are disposed between the first area and second area.

The power link line may further include a pad connecting line configured to connect either the central portion or an end of the upper power link line to a pad in the pad area.

The pad connecting line may include a first pad connecting line and a second pad connecting line disposed on both ends of the second non-active area in the pad area.

The upper power link line may include a first portion disposed on one end of the second non-active area, extending to the first area. The upper power link line may further include a second portion disposed on the other end of the second non-active area, extending to the second area.

The plurality of bending patterns may comprise repeated conductive patterns having at least one of a diamond, rhombic, zigzag, or circular shape.

According to another aspect of the present disclosure, there is provided a display device. The display device includes a substrate including an active area with a plurality of pixels and a non-active area adjacent to the active area. The display device further includes a plurality of power lines, including a plurality of both first power lines and second power lines, disposed in the active area and configured to transmit power voltage to the plurality of pixels. The display device further includes a power link line disposed in the non-active area, including a first lower power link line connected to the plurality of first power lines, and a second lower power link line connected to the plurality of second power lines. Further, the first lower power link line and the second lower power link line are each disposed in a left area and a right area, respectively, of the substrate to minimize the amount of a power voltage drop in the plurality of power lines and the power link line.

The non-active area may include a first non-active area adjacent to the active area, in which the first lower power link line and the second lower power link line are disposed. The non-active area may further include a bending area adjacent to the first non-active area, and a second non-active area adjacent to the bending area. The non-active area may further include a pad area adjacent to the second non-active area. The first lower power link line may extend to both ends of the left area in the first non-active area and the second lower power link line may extended to both ends of the right area in the first non-active area. The first lower power link line and the second lower power link line may be connected at the boundary between the left area and the right area.

The power link line may include a first lower connecting line extending from the first lower power link line to the bending area, and a second lower connecting line extending from the second lower power link line to the bending area. The plurality of first power lines may be disposed symmetrically with respect to the first lower connecting line. The plurality of second power lines may be disposed symmetrically with respect to the second lower connecting line.

The display device may further include a plurality of data lines disposed in the active area, configured to transmit data signals to the plurality of pixels. The display device may further include a plurality of data link lines disposed in the non-active area connected to the plurality of data lines. The power link line may further include a plurality of bending patterns disposed in the bending area, connected to the first lower power link line and the second lower power link line. The power link line may further include an upper power link line disposed in the second non-active area, which includes a first portion electrically connected to the first lower power link line and a second portion electrically connected to the second lower power link line. The first portion and second portions may overlap the plurality of data link lines to minimize deviations caused by an RC load in the plurality of data link lines.

The first lower power link line and second lower power link line may overlap the plurality of data link lines to minimize deviation caused by an RC load in the plurality of data link lines.

Although the embodiments of the present disclosure have been described in detail with reference to the accompanying drawings, the present disclosure is not limited thereto, and may be embodied in many different forms without departing from the technical concept of the present disclosure. Therefore, the embodiments of the present disclosure are provided for illustrative purposes only, and are not intended to limit the technical concept of the present disclosure. The scope of the technical concept of the present disclosure is not limited thereto. Therefore, it should be understood that the above-described embodiments are illustrative in all respects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate including an active area having a plurality of pixels and a non-active area adjacent to the active area;
    a plurality of power lines in the active area, configured to transmit a power voltage to the plurality of pixels, and including a plurality of first power lines and a plurality of second power lines; and
    a power link line in the non-active area and including:
        a lower power link line connected to the plurality of power lines,
        a first lower connecting line extending from the lower power link line, and
        a second lower connecting line extending from the lower power link line,
    wherein the first and second lower connecting lines extend in a different direction than the lower power link line,
    wherein the plurality of first power lines includes at least two sets of first power lines spaced apart from each other, and
    wherein the plurality of second power lines includes at least two sets of second power lines spaced apart from each other.

2. The display device according to claim 1, wherein the at least two sets of first power lines are spaced equidistant from the first lower connecting line, and
    wherein the at least two sets of second power lines are spaced equidistant from the second lower connecting line.

3. The display device according to claim 1, wherein the non-active area includes:
    a first non-active area;
    a bending area adjacent to the first non-active area;
    a second non-active area adjacent to the bending area; and
    a pad area adjacent to the second non-active area,
    wherein the substrate further includes a first area in which the plurality of first power lines and the first lower connecting line are disposed, and a second area in which the plurality of second power lines and the second lower connecting line are disposed,
    wherein the lower power link line includes a first lower power link line in the first area and a second lower power link line in the second area, and
    wherein the first lower connecting line and the second lower connecting line extend from the first lower power link line and the second lower power link line, respectively, toward the bending area.

4. The display device according to claim 3, wherein the first lower power link line extends towards opposite ends of the first area,
    wherein the second lower power link line extends towards opposite ends of the second area, and
    wherein the first lower power link line and the second lower power link line are connected at a boundary between the first area and the second area.

5. The display device according to claim 3, wherein the power link line further includes:
    a plurality of bending patterns in the bending area, and connected to the first lower connecting line and the second lower connecting line;
    an upper power link line in the second non-active area; and
    an upper connecting line in the second non-active area, and connecting the plurality of bending patterns to the upper power link line,
    wherein the upper power link line includes a first portion in the first area and a second portion in the second area.

6. The display device according to claim 5, wherein a first set of bending patterns among the plurality of bending patterns extend to the first lower connecting line from an end of the first portion of the upper power link line, and
wherein a second set of bending patterns among the plurality of bending patterns extend to the second lower connecting line from an end of the second portion of the upper power link line.

7. The display device according to claim 5, wherein the first portion of the upper power link line extends toward an edge of the first area and the second portion of the upper power link line extends toward an edge of the second area.

8. The display device according to claim 7, further comprising:
data lines in the active area of the substrate and configured to transmit data voltages to the plurality of pixels; and
data link lines in the non-active area of the substrate and connected to the plurality of data lines, respectively,
wherein the upper power link line overlaps with at least some of the data link lines.

9. The display device according to claim 8, wherein all of the data link lines cross the upper power link line.

10. The display device according to claim 5, wherein the plurality of bending patterns includes repeating conductive patterns having at least one of a diamond shape, a rhombic shape, a zigzag shape, or a circular shape.

11. The display device according to claim 3, further comprising:
a plurality of third power lines in the active area of the substrate and configured to transmit the power voltage to some of the plurality of pixels; and
a third lower power link line in the non-active area of the substrate and connected to the plurality of third power lines,
wherein the plurality of third power lines is between the plurality of first power lines and the plurality of second power lines.

12. The display device according to claim 1, wherein the power link line further includes a pad connecting line configured to connect the upper power link line to the pad area, or first and second pad connecting lines connected to the upper power link line.

13. The display device according to claim 12, wherein the first pad connecting line and the second pad connecting line are disposed at opposite sides of a second non-active area.

14. A display device, comprising:
a substrate including an active area having a plurality of pixels and a non-active area adjacent to the active area;
a plurality of power lines in the active area, configured to transmit a power voltage to the plurality of pixels, and including a plurality of first power lines and a plurality of second power lines; and
a power link line in the non-active area and including a first lower power link line connected to the plurality of first power lines and a second lower power link line connected to the plurality of second power lines,
wherein the at least two sets of first power lines are spaced symmetrically relative to a center of the first lower power link line, and
wherein the at least two sets of second power lines are spaced symmetrically relative to a center of the second lower power link line.

15. The display device according to claim 14, wherein the substrate includes a first area and a second area, and
wherein the non-active area includes:
a first non-active area adjacent to the active area, in which the first lower power link line and the second lower power link line are disposed;
a bending area adjacent to the first non-active area;
a second non-active area adjacent to the bending area;
a pad area adjacent to the second non-active area,
wherein the first lower power link line extends towards opposite ends of the first area of the substrate within the first non-active area,
wherein the second lower power link line extends towards opposite ends of the second area of the substrate within the first non-active area, and
wherein the first lower power link line and the second lower power link lines are connected at a boundary between the first area and the second area.

16. The display device according to claim 15, wherein the power link line includes a first lower connecting line extending from the first lower power link line to the bending area, and a second lower connecting line extending from the second lower power link line to the bending area,
wherein the plurality of first power lines is symmetrically with respect to the first lower connecting line, and
wherein the plurality of second power lines is symmetrically with respect to the second lower connecting line.

17. The display device according to claim 16, further comprising:
a plurality of data lines in the active area and configured to transmit data voltages to the plurality of pixels; and
a plurality of data link lines in the non-active area and connected to the plurality of data lines,
wherein the power link line further includes:
a plurality of bending patterns in the bending area and connected to the first lower power link line and the second lower power link line; and
an upper power link line in the second non-active area including a first portion electrically connected to the first lower power link line and a second portion electrically connected to the second lower power link line, and
wherein portions of each of the plurality of data link lines overlap with at least the first portion of the upper power link line or the second portion of the upper power link line for reducing a deviation caused by an RC load in the plurality of data link lines.

* * * * *